United States Patent
Kuo et al.

(10) Patent No.: US 12,158,498 B2
(45) Date of Patent: Dec. 3, 2024

(54) TESTING CIRCUITRY FOR TESTING MULTICYCLE PATH CIRCUIT

(71) Applicant: REALTEK SEMICONDUCTOR CORPORATION, Hsinchu (TW)

(72) Inventors: Chun-Yi Kuo, Hsinchu (TW); Po-Lin Chen, Hsinchu (TW); Yu-Cheng Lo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/134,580

(22) Filed: Apr. 14, 2023

(65) Prior Publication Data

US 2023/0349971 A1 Nov. 2, 2023

(30) Foreign Application Priority Data

Apr. 29, 2022 (TW) .................................. 111116458

(51) Int. Cl.
   *G01R 31/317* (2006.01)
   *G01R 31/3185* (2006.01)

(52) U.S. Cl.
   CPC .................. *G01R 31/31726* (2013.01); *G01R 31/318533* (2013.01)

(58) Field of Classification Search
   CPC .................. G01R 31/318533; G01R 31/31726
   See application file for complete search history.

(56) References Cited

U.S. PATENT DOCUMENTS

| 10,565,156 | B1* | 2/2020 | Schat | H04L 25/493 |
| 2005/0055615 | A1* | 3/2005 | Agashe | G01R 31/318552 |
| | | | | 714/727 |
| 2006/0176745 | A1* | 8/2006 | Eustis | G11C 29/48 |
| | | | | 365/201 |
| 2009/0125771 | A1* | 5/2009 | Duggal | G01R 31/318594 |
| | | | | 326/16 |
| 2009/0273383 | A1* | 11/2009 | Takatori | G01R 31/318552 |
| | | | | 327/218 |
| 2014/0091812 | A1* | 4/2014 | Wu | G06F 30/327 |
| | | | | 324/617 |
| 2015/0198663 | A1* | 7/2015 | Syed | G01R 31/31727 |
| | | | | 714/726 |
| 2016/0169966 | A1* | 6/2016 | Abshishek | G01R 31/318541 |
| | | | | 714/727 |
| 2017/0176535 | A1* | 6/2017 | Khandelwal | G01R 31/31727 |
| 2018/0238965 | A1* | 8/2018 | Anzou | G11C 11/418 |
| 2020/0074988 | A1* | 3/2020 | Park | G06N 3/045 |

* cited by examiner

*Primary Examiner* — Samir W Rizk (74) *Attorney, Agent, or Firm* — WPAT, P.C (57) ABSTRACT

A testing circuitry includes an on-chip clock controller circuit and a first clock adjustment circuit. The on-chip clock controller circuit is configured to generate an internal clock signal in response to a reference clock signal, a scan enable signal, a plurality of enable bits, and a scan mode signal, and generate a first control signal in response to the scan enable signal, a plurality of first bits, and the reference clock signal. The first clock adjustment circuit is configured to generate a first test clock signal according to the first control signal and the internal clock signal, in order to test a multicycle path circuit. The plurality of first bits are to set a first pulse of the first test clock signal, in order to prevent the multicycle path circuit from occurring a timing violation.

16 Claims, 5 Drawing Sheets

TESTING CIRCUITRY FOR TESTING MULTICYCLE PATH CIRCUIT

BACKGROUND OF THE INVENTION

1. Field of the Invention

The present disclosure relates to a testing circuitry, especially to a testing circuitry able to perform a test on multicycle path circuit(s).

2. Description of Related Art

To ensure that a chip meets design requirements, timing analysis can be performed on the chip to ensure that circuits in the chip operate correctly. To avoid timing errors when there is a multicycle path circuit in the chip, existing testing methods require turning off the multicycle path circuit or reducing a speed of a clock signal, which results in a lower test coverage. In other related approaches, in order to obtain a test result of the multicycle path circuit, it is able to try estimating a proper clock signal for the multicycle path circuit by adjusting test data from an automatic test pattern generator. However, in practical applications, the above estimation may result in the excessive running time for the automatic test pattern generator, and the automatic test pattern generator may be unable to generate the proper test data for the estimation.

SUMMARY OF THE INVENTION

In some aspects, an object of some embodiments of the present disclosure is, but not limited to, to provide a testing circuitry able to utilize bits to configure a clock signal for testing multicycle path circuit(s).

In some aspects of the present disclosure, a testing circuitry includes an on-chip clock controller circuit and a first clock adjustment circuit. The on-chip clock controller circuit is configured to generate an internal clock signal in response to a reference clock signal, a scan enable signal, a plurality of enable bits, and a scan mode signal, and generate a first control signal in response to the scan enable signal, a plurality of first bits, and the reference clock signal. The first clock adjustment circuit is configured to generate a first test clock signal according to the first control signal and the internal clock signal, in order to test a multicycle path circuit. The plurality of first bits are to set a first pulse of the first test clock signal, in order to prevent the multicycle path circuit from occurring a timing violation.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits, and the term "circuit" may indicate an object, which is formed with one or more transistors and/or one or more active/passive elements based on a specific arrangement, for processing signals.

As used herein, "about", "approximate to", or "equal to" shall generally mean within 20 percent, preferably within 10 percent, and more preferably within 5 percent of a given value or range. Numerical quantities given herein are approximate, meaning that the term "about", "approximate to", or "equal to" can be inferred if not expressly stated.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
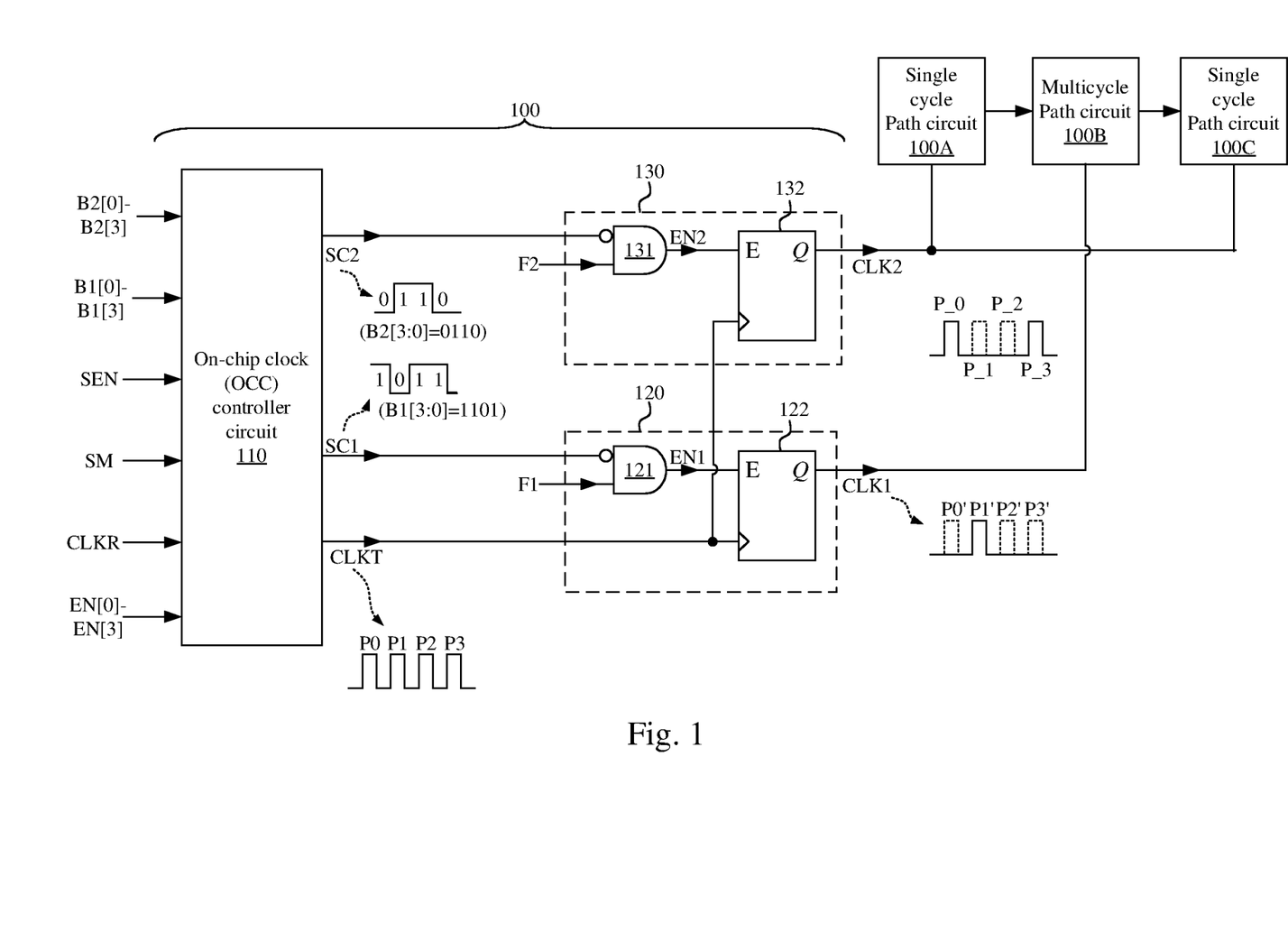
FIG. 1 illustrates a schematic diagram of a testing circuitry according to some embodiments of the present disclosure.

FIG. 1 illustrates a schematic diagram of a testing circuity 100 according to some embodiments of the present disclosure. The testing circuity 100 may perform test(s) (which may be, but not limited to, a scan test, a static timing analysis, or the like) on a multicycle path circuit 100B, a single cycle path circuit 100A, and a single cycle path circuit 100C. In this example, the single cycle path circuit 100A, the multicycle path circuit 100B, and the single cycle path circuit 100C are sequentially coupled in series. In some embodiments, the testing circuity 100, the multicycle path circuit 100B, the single cycle path circuit 100A, and the single cycle path circuit 100C may be integrated into a single chip.

In some embodiments, a signal (or data) transferred between two registers (or flip flops) in the multicycle path circuit 100B may take at least two cycles to be stable. In other words, at least two cycles are present between a setup time and a hold time of the multicycle path circuit 100B. For example, a signal transferring from an input of the multicycle path circuit 100B (e.g., a signal path between the single cycle path circuit 100A and the multicycle path circuit 100B) to an output of the multicycle path circuit 100B (e.g., a signal path between the multicycle path circuit 100B and the single cycle path circuit 100C) may take at least two cycles. In some embodiments, a signal (or data) transferred between two registers (or flip flops) in the single cycle path circuit 100A (or 100C) may take one only cycle to be stable. In different embodiments, each of the multicycle path circuit 100B, the single cycle path circuit 100A, and the single cycle path circuit 100C may be implemented with digital logic circuit(s).

The testing circuity 100 includes an on-chip clock (OCC) controller circuit 110, a clock adjustment circuit 120, and a clock adjustment circuit 130. The OCC controller circuit 110 may generate an internal clock signal CLKT in response to a reference clock signal CLKR, a scan enable signal SEN, enable bits EN[0]-EN[3], and a scan mode signal SM. In some embodiments, the reference clock signal CLKR may be generated by, but not limited to, a phase locked loop circuit. Moreover, the OCC controller circuit 110 may further generate a control signal SC1 in response to the scan enable signal SEN, bits B1[0]-B1[3], and the reference clock signal CLKR and generate a control signal SC2 in response to the scan enable signal SEN, bits B2[0]-B2[3], and the reference clock signal CLKR.

The clock adjustment circuit 120 is configured to generate a test clock signal CLK1 in response to the control signal SC1 and the internal clock signal CLKT, in order to test the multicycle path circuit 100B. The clock adjustment circuit 130 is configured to generate a test clock signal CLK2 in response to the control signal SC2 and the internal clock signal CLKT, in order to test the single cycle path circuits 100A and 100C.

In some embodiments, the clock adjustment circuit 120 includes a logic gate circuit 121 and a clock gating circuit 122. The logic gate circuit 121 is configured to generate an enable signal EN1 in response to a logical inversion of the control signal SC1. For example, the logic gate circuit 121 may be, but not limited to, an AND gate circuit having an inverting input terminal, in which the inverting input terminal receives the control signal SC1, and another input terminal may receive a test signal F1. In some embodiments, the test signal F1 may be, but not limited to, test data from an automatic test pattern generator. The clock gating circuit 122 may generate the test clock signal CLK1 in response to the enable signal EN1 and the internal clock signal CLKT. For example, the clock gating circuit 122 may be, but not limited to, an integrated clock gating (ICG) cell, which may determine whether to generate pulses of the test clock signal CLK1 according to the enable signal EN1.

In some embodiments, the clock adjustment circuit 120 and the clock adjustment circuit 130 may have the same circuit architecture. For example, similar to the clock adjustment circuit 120, the clock adjustment circuit 130 may include a logic gate circuit 131 and a clock gating circuit 132. The logic gate circuit 131 may be configured to generate an enable signal EN2 in response to a logical inversion of a control signal SC2. For example, the logic gate circuit 131 may be, but not limited to, an AND gate circuit having an inverting input terminal, in which the inverting input terminal receives the control signal SC2, and another input terminal (i.e., a non-inverting input terminal) receives a test signal F2. In some embodiments, the test signal F2 may be, but not limited to, test data from an automatic test pattern generator. The clock gating circuit 132 may generate the test clock signal CLK2 in response to the enable signal EN2 and the internal clock signal CLKT. For example, the clock gating circuit 132 may be, but not limited to, an ICG cell, which may sequentially determine whether to generate pulses of the test clock signal CLK2 according to the enable signal EN2.

With such arrangements, the bits B1[0]-B1[3] may be configured to set at least one pulse of the test clock signal CLK1, in order to prevent the multicycle path circuit 100B from occurring a timing violation. In some embodiments, the timing violation may include, but not limited to, a hold time violation, a setup time violation, and so on. Moreover, in this example, the bits B1 [0]-B1 [3] and the bits B2[0]-B2[3] may be further configured to set intervals between pulses of the test clock signal CLK1 (e.g., pulse P1') and pulses of the test clock signal CLK2 (e.g., pulses P_0-P_3), in order to avoid the timing violation.

Taking examples in FIG. 1, when the single cycle path circuit 100A is triggered by a pulse P0 of the internal clock signal CLKT, the single cycle path circuit 100A may generate a stable output within one cycle (which corresponds to one pulse width) and transmit the same to the multicycle path circuit 100B. Accordingly, the multicycle path circuit 100B is triggered by a pulse P1 of the internal clock signal CLKT to receive the output of the single cycle path circuit 100A, and may generate a stable output after two cycles (which corresponds to two pulse widths). Accordingly, the single cycle path circuit 100C may be triggered by a pulse P3 of the internal clock signal CLKT to receive the output of the multicycle path circuit 100B for subsequent operations. As a result, it is able to avoid various timing violations without reducing the speed of the internal clock signal CLKT, in order to correctly test the single cycle path circuit 100A, the multicycle path circuit 100B, and the single cycle path circuit 100C.

To implement the aforementioned timings, the bits B1[0]-B1[3] may be sequentially set as logic values of 1, 0, 1, and 1 (which are labeled as B1[3:0]=1101 in FIG. 1), and the bits B2[0]-B2[3] may be sequentially set as logic values of 0, 1, 1, and 0 (which are labeled as B2[3:0]=0110 in FIG. 1). The OCC controller circuit 110 may generate the control signal SC1 corresponding to the bits B1[0]-B1[3] (which sequentially has the logic values of 1, 0, 1, and 1 from left to right) and the control signal SC2 corresponding to the bits B2[0]-B2[3] (which sequentially have the logic values of 0, 1, 1, and 0). As a result, the clock adjustment circuit 120 may output the pulse P1 of the internal clock signal CLKT to be the pulse P1' of the test clock signal CLK1 in response to a logical inversion of the bits of the control signal SC1.

For example, as the bit B1[3] has the logic value of 1, the logical inversion of the bit B1[3] is the logic value of 0, such that the logic gate circuit 121 outputs the enable signal EN1 having the logic value of 0. Under this condition, the clock gating circuit 122 masks (or disables) the pulse P3 of the internal clock signal CLKT, such that the corresponding pulse P3' of the test clock signal CLK1 is removed (shown with dotted lines). With this analogy, in response to the bits B1[0] and B1[2], the clock gating circuit 122 masks (or disables) the pulses P0 and P2 of the internal clock signal CLKT, such that the pulse P0' and P2' of the test clock signal CLK1 are removed (shown with dotted lines). Correspondingly, as the bit B1[1] has the logic value of 0, the logical inversion of the bit B1[1] is the logic value of 1, such that the logic gate circuit 121 outputs the enable signal EN1 having the logic value of 1 (it is assumed that the test signal F1 has the logic value of 1). Under this condition, the clock gating circuit 132 does not mask the pulse P1 of the internal clock signal CLKT, and outputs the pulse P1 to be the pulse P1' of the test clock signal CLK1. Based on similar operations, the clock adjustment circuit 130 may sequentially output pulses P0 and P3 of the internal clock signal CLKT to be pulses P_0 and P_3 of the test clock signal CLK2 and remove pulses P_1 and P_2 (shown with dotted lines) of the test clock signal CLK2 in response to logical inversions of bits of the control signal SC2. Equivalently, by setting the bits B1[0]-B1[3] and B2[0]-B2[3], intervals among the pulse P1' of the test clock signal CLK1 and the pulses P_0 and P_3 of the test clock signal CLK2. For example, as shown in FIG. 1, the pulses P1', P_0, and P_3 are non-consecutive pulses. As a result, it is able to prevent a circuit under-test (e.g., the multicycle path circuit 100B, the single cycle path circuit 100A, and the single cycle path circuit 100C) from occurring a timing violation.

It is understood that, according to different practical needs (e.g., different circuits under-test), number of control signals (i.e., the control signals SC1 and SC2) generated by the OCC controller circuit 110 can be different. In different embodiments, the number of control signals generated from the OCC controller circuit 110 may be at least one. For example, if a circuit under-test only has the multicycle path circuit 100B, the OCC controller circuit 110 may only generate the control signal SC1, and the testing circuity 100 may only include the clock adjustment circuit 120. Accordingly, the present disclosure is not limited to arrangement in FIG. 1, and various numbers of the clock adjustment circuits and/or various numbers of control signals are within the contemplated scope of the present disclosure.

Figure 2:
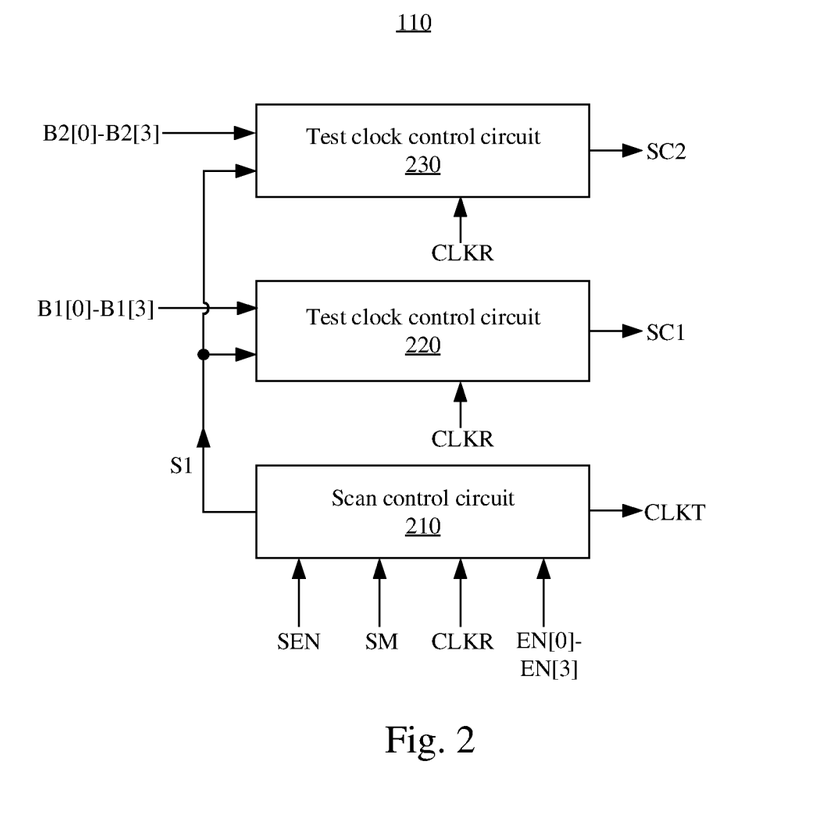
FIG. 2 illustrates a schematic diagram of the on-chip clock (OCC) controller circuit in FIG. 1 according to some embodiments of the present disclosure.

FIG. 2 illustrates a schematic diagram of the OCC controller circuit 110 in FIG. 1 according to some embodiments of the present disclosure. In this example, the OCC controller circuit 110 includes a scan control circuit 210, a test clock control circuit 220, and a test clock control circuit 230. The scan control circuit 210 is configured to generate a signal S1 in response to the scan enable signal SEN and the reference clock signal CLKR, and generate the internal clock signal CLKT according to the signal S1, the enable bits EN[0]-EN[3], and the scan mode signal SM. The test clock control circuit 220 is configured to generate the control signal SC1 in response to the signal S1, the bits B1[0]-B1[3], and the reference clock signal CLKR. Similarly, the test clock control circuit 230 is configured to generate the control signal SC2 in response to the signal S1, the bits B2[0]-B2[3], and the reference clock signal CLKR. In some embodiments, the scan control circuit 210, the test clock control circuit 220, and the test clock control circuit 230 may be synchronized with signal S1.

It is understood that, in some other embodiments, if a circuit under-test only includes the multicycle path circuit 100B, the OCC controller circuit 110 may only generate the control signal SC1. Under this condition, the OCC controller circuit 110 may exclude the test clock control circuit 230.

Figure 3:
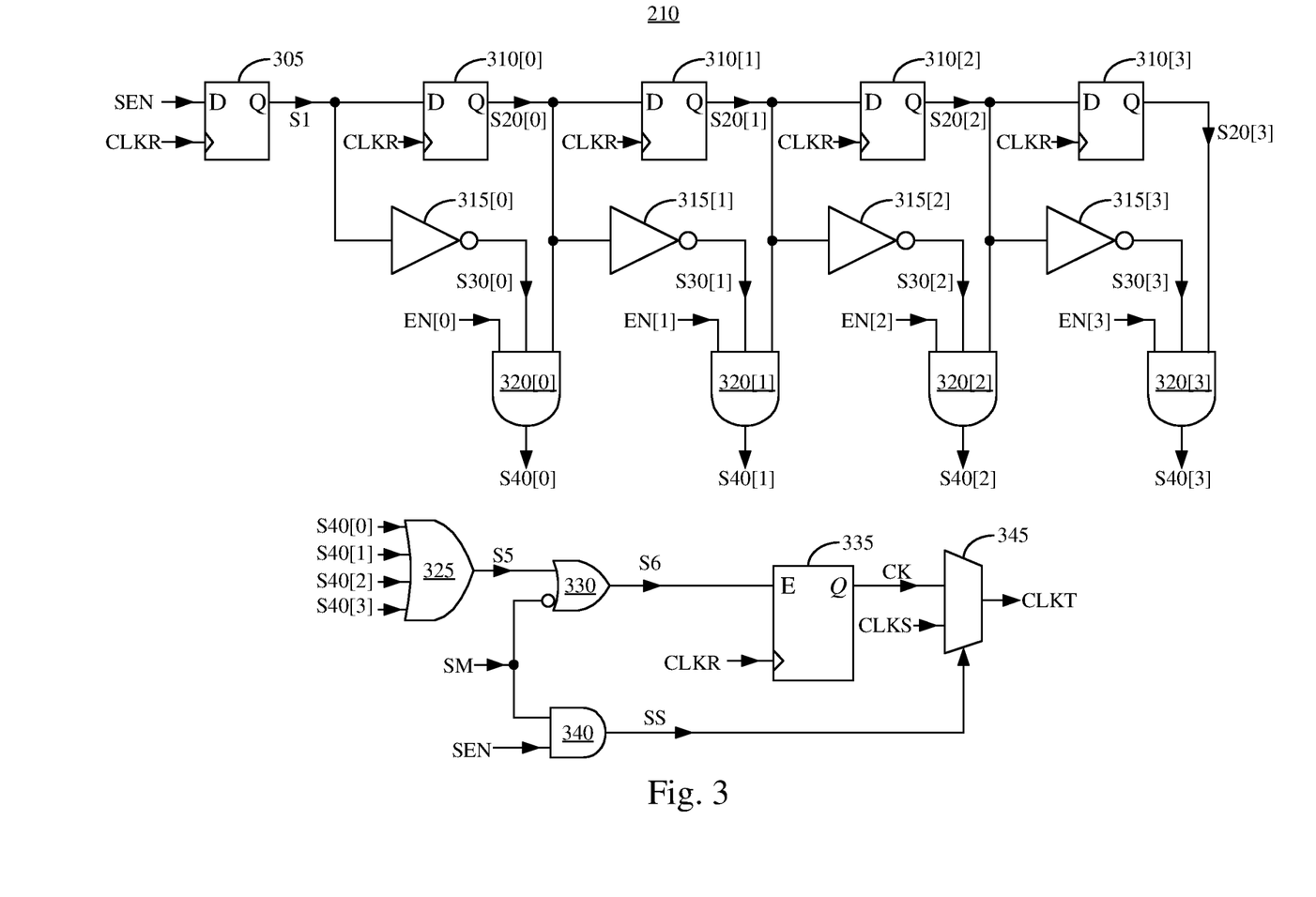
FIG. 3 illustrates a schematic diagram of the scan control circuit in FIG. 2 according to some embodiments of the present disclosure.

FIG. 3 illustrates a schematic diagram of the scan control circuit 210 in FIG. 2 according to some embodiments of the present disclosure. In some embodiments, the scan control circuit 210 includes a D-type flip flop circuit 305, D-type flip flop circuits 310[0]-310[3], inverter circuits 315[0]-315[3], logic gate circuits 320[0]-320[3], a logic gate circuit 325, a logic gate circuit 330, a clock gating circuit 335, a logic gate circuit 340, and a multiplexer circuit 345. The D-type flip flop circuit 305 is trigged by the reference clock signal CLKR to output the scan enable signal SEN to be the signal S1. The D-type flip flop circuit 310[0]-310[3] are coupled in series, and are trigged by the reference clock signal CLKR to sequentially output signals S20[0]-S20[3] according to the signal S1. Each of the inverter circuits 315[0]-315[3] generates a corresponding one of signals S30[0]-S30[3] according to a corresponding one of the signals S1 and S20[0]-S20[2]. For example, the inverter circuit 315[0] generates the signal S30[0] according to the signal S1, and the inverter circuit 315[1] generates the signal S30[1] according to the signal S20[0]. With this analogy, the arrangements of the remaining the inverter circuits 315[2] and 315[3] can be understood.

Each of the logic gate circuits 320[0]-320[3] is configured to generate a corresponding one of signals S40[0]-S40[3] according to a corresponding one of the signals S30[0]-S30[3], a corresponding one of the enable bits EN[0]-EN[3], and a corresponding one of the signals S20[0]-S20[3]. For example, the logic gate circuit 320[0] generates the signal S40[0] according to the signal S30[0], the enable bit EN[0], and the signal S20[0]. The logic gate circuit 320[1] generates the signal S40[1] according to the signal S30[1], the enable bit EN[1], and the signal S20[1]. With this analogy, the arrangements of the remaining logic gate circuits 320[2] and 320[3] can be understood. In some embodiments, each of the logic gate circuits 320[0]-320[3] may be, but not limited to, an AND gate circuit.

The logic gate circuit 325 is configured to generate a signal S5 according to the signals S40[0]-S40[3]. In some embodiments, the logic gate circuit 325 may be, but not limited to, an OR gate circuit. The logic gate circuit 330 is configured to generate a signal S6 according to the signal S5 and the scan mode signal SM. In some embodiments, the logic gate circuit 330 may be, but not limited to, an OR gate circuit having an inverting input terminal, in which the inverting input terminal receives the scan mode signal SM, and another input terminal (i.e., a non-inverting input terminal) receives the signal S5. The clock gating circuit 335 is configured to generate a clock signal CK according to the signal S6 and the reference clock signal CLKR. The logic gate circuit 340 generates a switching signal SS according to the scan mode signal SM and the scan enable signal SEN. In some embodiments, the logic gate circuit 340 may be, but not limited to, an OR gate circuit having an inverting input terminal. The multiplexer circuit 345 is configured to output a scan clock signal CLKS or the clock signal CK to be the internal clock signal CLKT according to the switching signal SS.

Figure 4:
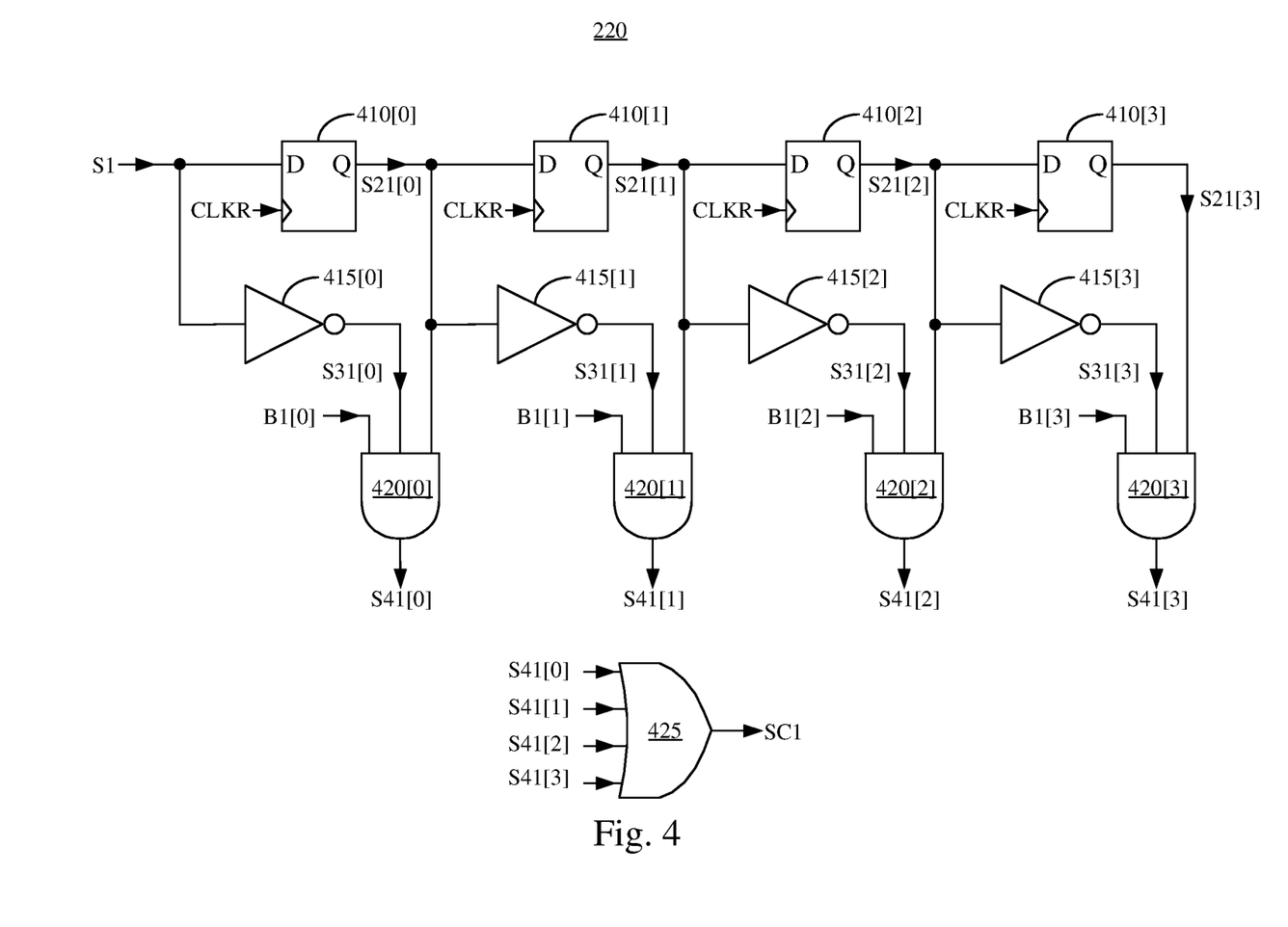
FIG. 4 illustrates a schematic diagram of the test clock control circuit in FIG. 2 according to some embodiments of the present disclosure.

FIG. 4 illustrates a schematic diagram of the test clock control circuit 220 in FIG. 2 according to some embodiments of the present disclosure. In this example, the test clock control circuit 220 includes D-type flip flop circuits 410[0]-410[3], inverter circuits 415[0]-415[3], logic gate circuits 420[0]-420[3], and a logic gate circuit 425. The D-type flip flop circuits 410[0]-410[3] are coupled in series, and are trigged by the reference clock signal CLKR to sequentially output signals S21[0]-S21[3] according to the signal S1.

The inverter circuits 415[0]-415[3] generates signals S31[0]-S31[3] according to the signal S1 and part signals in the signals S21[0]-S21[3]. In some embodiments, the part signals in the signals S21[0]-S21[3] excludes the last signal S21[3]. That is, the part signals may be the signals S21[0]-S21[2]. In greater detail, each of the inverter circuits 415[0]-415[3] generates a corresponding one of the signals S31[0]-S31[3] according to a corresponding one of the signals S1 and S21[0]-S21[2]. For example, the inverter circuit 415[0] generates the signal S31[0] according to the signal S1, and the inverter circuit 415[1] generates the signal S31[1] according to the signal S21[0]. With this analogy, the arrangements of the remaining inverter circuits 415[2] and 415[3] can be understood.

Each of the logic gate circuits 420[0]-420[3] is configured to generate a corresponding one of signals S41[0]-S41[3] according to a corresponding one of the signals S31[0]-S31[3], a corresponding one of the bits B1[0]-B1[3], and a corresponding one of the signals S21[0]-S21[3]. For example, the logic gate circuit 420[0] generates the signal S41[0] according to the signal S31[0], the bit B1[0], and the signal S21[0]. The logic gate circuit 420[1] generates the signal S41[1] according to the signal S31[1], the bit B1[1], and the signal S21[1]. With this analogy, the arrangements of the remaining logic gate circuits 420[2] and 420[3] can be understood. In some embodiments, each of the logic gate circuits 420[0]-420[3] may be, but not limited to, an AND gate circuit. The logic gate circuit 425 is configured to generate the control signal SC1 according to the signals S41[0]-S41[3]. In some embodiments, the logic gate circuit 425 may be, but not limited to, an OR gate circuit.

With the above arrangements, the bits of the control signal SC1 can be configured with the bits B1[0]-B1[3]. As a result, the clock adjustment circuit 120 in FIG. 1 is able to generate a corresponding test clock signal CLK1. In other words, a user may set logic values of the bits B1[0]-B1[3] according to a timing required by the multicycle path circuit 100B to directly adjust the timing of the test clock signal CLK1, in order to avoid timing violation(s).

Figure 5:
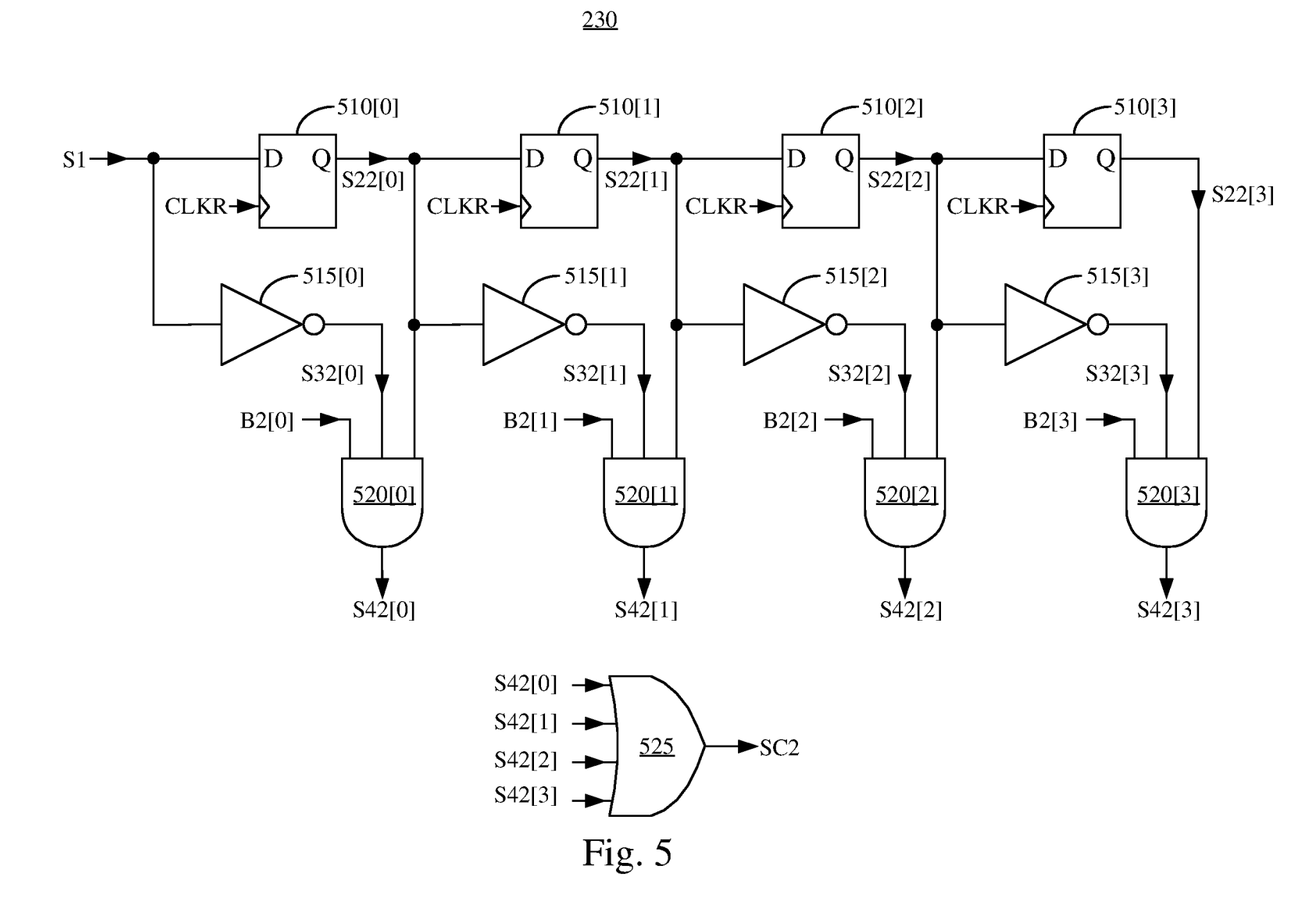
FIG. 5 illustrates a schematic diagram of the test clock control circuit in FIG. 2 according to some embodiments of the present disclosure.

FIG. 5 illustrates a schematic diagram of the test clock control circuit 230 in FIG. 2 according to some embodiments of the present disclosure. In some embodiments, the test clock control circuit 220 and the test clock control circuit 230 may have the same circuit architecture. For example, the test clock control circuit 230 includes D-type flip flop circuits 510[0]-510[3], inverter circuits 515[0]-515[3], logic gate circuits 520[0]-520[3], and a logic gate circuit 525. The D-type flip flop circuits 510[0]-510[3] are coupled in series, and are triggered by the reference clock signal CLKR to sequentially output signals S22[0]-S22[3] according to the signal S1.

The inverter circuits 515[0]-515[3] generates signals S32[0]-S32[3] according to the signal S1 and part signals in the signals S22[0]-S22[3]. In some embodiments, the part signals in the signals S22[0]-S22[3] excludes the last signal S22[3]. That is, the part signals are the signals S22[0]-S22[2]. In greater detail, each of the inverter circuits 515[0]-515[3] generates a corresponding one of the signals S32[0]-S32[3] according to a corresponding one of the signals S1 and S22[0]-S22[2]. For example, the inverter circuit 515[0] generates the signal S32[0] according to the signal S1, and the inverter circuit 515[1] generates the signal S32[1] according to the signal S22[0]. With this analogy, the arrangements of the remaining inverter circuits 515[2] and 515[3] can be understood.

Each of the logic gate circuits 520[0]-520[3] is configured to generate a corresponding one of signals S42[0]-S42[3] according to a corresponding one of the signals S32[0]-S32[3], a corresponding one of the bits B2[0]-B2[3], and a corresponding one of the signals S22[0]-S22[3]. For example, the logic gate circuit 520[0] generates the signal S42[0] according to the signal S32[0], the bit B2[0], and the signal S22[0]. The logic gate circuit 520[1] generates the signal S42[1] according to the signal S32[1], the bit B2[1], and the signal S22[1]. With this analogy, the arrangements of the remaining logic gate circuits 520[2] and 520[3] can be understood. In some embodiments, each of the logic gate circuits 520[0]-520[3] may be, but not limited to, an AND gate circuit. The logic gate circuit 525 is configured to generate the control signal SC2 according to the signals S42[0]-S42[3]. In some embodiments, the logic gate circuit 525 may be, but not limited to, an OR gate circuit.

Similarly, with the above arrangements, it is able to set bits of the control signal SC2 with the bits B2[0]-B2[3]. As a result, the clock adjustment circuit 130 in FIG. 1 is able to generate the corresponding test clock signal CLK2 accordingly. In other words, if a circuit under-test includes a multicycle path circuit (e.g., the multicycle path circuit 100B in FIG. 1) and a single cycle path circuit (e.g., the single cycle path circuits 100A and 100C in FIG. 1), a user may set logic values of the bits B1[0]-B1[3] and B2[0]-B2[3] according to the connection between the multicycle path circuit and the single cycle path circuit and timings required by both parties to directly adjust the timing of the test clock signals CLK1 and CLK2, in order to avoid timing violation(s). As a result, it is able to perform an at-speed test without reducing the speed of the internal clock signal CLKT or turning off the multicycle path circuit, in order to obtain a higher test coverage.

Circuit arrangements shown in the above embodiments are given for illustrative purposes, and the present disclosure is not limited thereto. Various circuit arrangements able to implement the same or similar functions are within the contemplated scope.

As described above, the testing circuitry in some embodiments of the present disclosure may utilize configurable bits to set timing(s) of test clock signal(s). As a result, it is able to perform timing analysis on a multicycle path circuit without reducing the circuit speed, in order to obtain a higher test coverage.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:
1. A testing circuitry, comprising:
an on-chip clock controller circuit configured to generate an internal clock signal in response to a reference clock signal, a scan enable signal, a plurality of enable bits, and a scan mode signal, and generate a first control signal in response to the scan enable signal, a plurality of first bits, and the reference clock signal; and a first clock adjustment circuit configured to generate a first test clock signal according to the first control signal and the internal clock signal, in order to test a multicycle path circuit,
wherein the plurality of first bits are to set a first pulse of the first test clock signal, in order to prevent the multicycle path circuit from occurring a timing violation, and the on-chip clock controller circuit comprises:
a scan control circuit configured to generate a first signal in response to the scan enable signal and the reference clock signal, and generate the internal clock signal according to the first signal, the plurality of enable bits, and the scan mode signal; and
a test clock control circuit configured to generate the first control signal in response to the first signal, the plurality of first bits, and the reference clock signal,
wherein the test clock control circuit is configured to:
sequentially output a plurality of second signals according to the reference clock signal and the first signal;
generate a plurality of third signals according to the first signal and a plurality of part signals in the plurality of second signals;
generate a plurality of fifth signals according to the plurality of first bits, the plurality of third signals, and the plurality of second signals; and
generate the first control signal according to the plurality of fifth signals.

2. The testing circuitry of claim 1, wherein the scan control circuit and the test clock control circuit are synchronized with the first signal.

3. The testing circuitry of claim 1, wherein the test clock control circuit comprises:
a plurality of D-type flip flop circuits coupled in series and configured to be triggered by the reference clock signal to sequentially output the plurality of second signals according to the first signal;
a plurality of inverter circuits configured to generate the plurality of third signals according to the first signal and the plurality of part signals in the plurality of second signals;
a plurality of first logic gate circuits, wherein each of the plurality of first logic gate circuits is configured to generate a corresponding one of the plurality of fifth signals according to a corresponding one of the plurality of first bits, a corresponding one of the plurality of third signals, and a corresponding one of the plurality of second signals; and
a second logic gate circuit configured to generate the first control signal according to the plurality of fifth signals.

4. The testing circuitry of claim 3, wherein each of the plurality of first logic gate circuits is an AND gate circuit.

5. The testing circuitry of claim 3, wherein the second logic gate circuit is an OR gate circuit.

6. The testing circuitry of claim 1, wherein the plurality of part signals in the plurality of second signals excludes a last signal in the plurality of second signals.

7. The testing circuitry of claim 1, wherein the scan control circuit comprises:
a first D-type flip flop circuit configured to be trigged by the reference clock signal to output the scan enable signal to be the first signal;
a plurality of second D-type flip flop circuits coupled in series and configured to be triggered by the reference clock signal to sequentially output a plurality of sixth signals according to the first signal;
a plurality of inverter circuits configured to generate a plurality of seventh signals according to the first signal and a plurality of part signals in the plurality of sixth signals;
a plurality of first logic gate circuits, wherein each of the plurality of first logic gate circuits is configured to generate a corresponding one of a plurality of eighth signals according to a corresponding one of the plurality of enable bits, a corresponding one of the plurality of seventh signals, and a corresponding one of the plurality of sixth signals;
a second logic gate circuit configured to generate a ninth signal according to the plurality of eighth signals;
a third logic gate circuit configured to generate a tenth signal according to the ninth signal and the scan mode signal;
a fourth logic gate circuit configured to generate a switching signal according to the scan mode signal and the scan enable signal;
a clock gating circuit configured to generate a first clock signal according to the sixth-tenth signal and the reference clock signal; and
a multiplexer circuit to output a scan clock signal or the first clock signal to be the internal clock signal according to the switching signal.

8. The testing circuitry of claim 7, wherein the plurality of part signals in the plurality of sixth signals excludes a last signal in the plurality of sixth signals.

9. The testing circuitry of claim 7, wherein each of the plurality of first logic gate circuits is an AND gate circuit.

10. The testing circuitry of claim 7, wherein the second logic gate circuit is an OR gate circuit having an inverting input terminal that is configured to receive the scan mode signal.

11. The testing circuitry of claim 1, wherein the on-chip clock controller circuit is further configured to generate a second control signal in response to the scan enable signal, a plurality of second bits, and the reference clock signal, and the testing circuitry further comprises:
a second clock adjustment circuit configured to generate a second test clock signal according to the second control signal and the internal clock signal, in order to test a single cycle path circuit, wherein the single cycle path circuit is coupled to the multicycle path circuit.

12. The testing circuitry of claim 11, wherein the plurality of first bits and the plurality of second bits are to set intervals among the first pulse and a plurality of second pulses of the second test clock signal, in order to avoid the timing violation.

13. The testing circuitry of claim 12, wherein the first pulse and the plurality of second pulses are non-consecutive pulses.

14. The testing circuitry of claim 1, wherein the first clock adjustment circuit comprises:
a logic gate circuit configured to generate an enable signal in response to a logical inversion of the first control signal; and
a clock gating circuit configured to generate the first test clock signal in response to the enable signal and the internal clock signal.

15. The testing circuitry of claim 14, wherein the logic gate circuit is an AND gate circuit having an inverting input terminal, and the inverting input terminal is configured to receive the first control signal.

16. A testing circuitry, comprising:
an on-chip clock controller circuit configured to generate an internal clock signal in response to a reference clock signal, a scan enable signal, a plurality of enable bits, and a scan mode signal, and generate a first control signal in response to the scan enable signal, a plurality of first bits, and the reference clock signal; and a first clock adjustment circuit configured to generate a first test clock signal according to the first control signal and the internal clock signal, in order to test a multicycle path circuit, wherein the plurality of first bits are to set a first pulse of the first test clock signal, in order to prevent the multicycle path circuit from occurring a timing violation, and the on-chip clock controller circuit comprises:

a scan control circuit configured to generate a first signal in response to the scan enable signal and the reference clock signal, and generate the internal clock signal according to the first signal, the plurality of enable bits, and the scan mode signal; and a test clock control circuit configured to generate the first control signal in response to the first signal, the plurality of first bits, and the reference clock signal, wherein the scan control circuit is configured to:

output the scan enable signal to be the first signal according to the reference clock signal;

sequentially output a plurality of second signals according to the reference clock signal and the first signal;

generate a plurality of third signals according to the first signal and a plurality of part signals in the plurality of second signals;

generate a plurality of fourth signals according to the plurality of enable bits, the plurality of third signals, and the plurality of second signals;

generate a fifth signal according to the plurality of fourth signals;

generate a sixth signal according to the fifth signal and the scan mode signal;

generate a switching signal according to the scan mode signal and the scan enable signal;

generate a first clock signal according to the sixth signal and the reference clock signal; and output a scan clock signal or the first clock signal to be the internal clock signal according to the switching signal.

\* \* \* \* \*